United States Patent
Lin

(10) Patent No.: US 10,102,167 B2
(45) Date of Patent: Oct. 16, 2018

(54) DATA PROCESSING CIRCUIT AND DATA PROCESSING METHOD

(71) Applicant: REALTEK SEMICONDUCTOR CORPORATION, Hsinchu (TW)

(72) Inventor: Chia-Chiang Lin, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/601,603

(22) Filed: May 22, 2017

(65) Prior Publication Data
US 2017/0344505 A1    Nov. 30, 2017

(30) Foreign Application Priority Data

May 25, 2016    (TW) .............................. 105116204 A

(51) Int. Cl.
G06F 3/16 (2006.01)
H03M 1/06 (2006.01)
H03M 1/12 (2006.01)
H03M 1/66 (2006.01)
G06F 11/30 (2006.01)
G06F 13/38 (2006.01)

(52) U.S. Cl.
CPC ............ G06F 13/385 (2013.01); G06F 3/162 (2013.01); G06F 11/3055 (2013.01); H03M 1/0607 (2013.01); H03M 1/12 (2013.01); H03M 1/66 (2013.01)

(58) Field of Classification Search
CPC .............. H04R 27/00; H04R 2227/003; H04R 1/1041; H04R 2420/07; H04R 5/04; H04R 1/10; H04R 2420/05; G06F 3/165; G06F 3/162

USPC .......... 700/94; 381/58, 123; 710/104, 14, 19
See application file for complete search history.

(56) References Cited

U.S. PATENT DOCUMENTS

| | | | | |
|---|---|---|---|---|
| 7,962,668 B2* | 6/2011 | Ding | ........................ | G06F 3/16 710/31 |
| 8,719,461 B2* | 5/2014 | Kim | .................... | H04M 1/6058 710/11 |
| 9,158,496 B2* | 10/2015 | Soffer | ...................... | G06F 21/83 |
| 9,201,827 B2* | 12/2015 | Lydon | ................... | G06F 13/385 |
| 2007/0129951 A1* | 6/2007 | Tong | .......................... | G06F 3/16 704/500 |
| 2008/0228969 A1* | 9/2008 | Cheah | ................... | G06F 13/385 710/69 |
| 2008/0248764 A1* | 10/2008 | Oh | ......................... | G11B 31/02 455/91 |
| 2013/0141153 A1* | 6/2013 | Chang | .................... | H03K 5/007 327/365 |

(Continued)

FOREIGN PATENT DOCUMENTS

TW        M463861        10/2013

*Primary Examiner* — Faisal M Zaman
(74) *Attorney, Agent, or Firm* — WPAT, PC

(57) ABSTRACT

This invention discloses a data processing circuit and a data processing method. The data processing method controls data transmission between a USB control unit and a USB interface, and includes the steps of: detecting a voltage of a configuration channel pin of the USB interface to generate a detection signal; determining whether the USB control unit and the USB interface are connected according to the detection signal; and performing an audio signal processing procedure when the USB control unit and the USB interface are not connected.

6 Claims, 10 Drawing Sheets

(56) References Cited

U.S. PATENT DOCUMENTS

| | | | |
|---|---|---|---|
| 2014/0003616 A1* | 1/2014 | Johnson | H04R 29/001 381/74 |
| 2015/0223758 A1* | 8/2015 | Park | A61B 5/0428 600/509 |
| 2015/0230018 A1* | 8/2015 | Wen | H04R 1/1041 381/59 |
| 2015/0264513 A1* | 9/2015 | Ryazanov | G06F 3/162 710/70 |
| 2016/0056782 A1* | 2/2016 | Lee | H03G 3/20 381/107 |
| 2016/0330049 A1* | 11/2016 | Roh | H04L 25/06 |
| 2017/0046115 A1* | 2/2017 | Rahardjo | G06F 3/162 |
| 2017/0075839 A1* | 3/2017 | Lu | G06F 13/38 |

* cited by examiner

| A1 | A2 | A3 | A4 | A5 | A6 | A7 | A8 | A9 | A10 | A11 | A12 |
|---|---|---|---|---|---|---|---|---|---|---|---|
| GND | TX1+ | TX1− | $V_{BUS}$ | CC1 | D+ | D− | SUB1 | $V_{BUS}$ | RX2− | RX2+ | GND |

| B12 | B11 | B10 | B9 | B8 | B7 | B6 | B5 | B4 | B3 | B2 | B1 |
|---|---|---|---|---|---|---|---|---|---|---|---|
| GND | RX1+ | RX1− | $V_{BUS}$ | SUB2 | D− | D+ | CC2 | $V_{BUS}$ | TX2− | TX2+ | GND |

Fig. 1 (prior art)

DATA PROCESSING CIRCUIT AND DATA PROCESSING METHOD

BACKGROUND OF THE INVENTION

1. Field of the Invention

The present invention relates to a data processing circuit and a data processing method for a Universal Serial Bus (USB) device, and more particularly, to a data processing circuit and a data processing method for USB Type-C or USB 3.1.

2. Description of Related Art

FIG. 1 shows a pin diagram of a USB Type-C connector, which is a reversible design. According to definitions in the USB 3.1 specifications, in addition to transmitting data signals, pins A6/B6 and A7/B7 may also be used to transmit audio signals. Pins A5/B5 are configuration channel pins. By detecting the potentials at the pins A5/B5, a USB host may learn whether a USB device currently connected is an audio device. However, the impedance of the USB device needs to be detected before audio signals can be transmitted. Further, in order to enhance user experiences, pops also need to be prevented. Therefore, there is a need for a solution capable of de-popping and impedance detection for USB Type-C.

SUMMARY OF THE INVENTION

In view of the issues of the prior art, an object of the present invention is to provide a data processing circuit and a data processing method, so as to provide a solution capable of de-popping and/or impedance detection for USB Type-C audio devices.

A data processing circuit is disclosed. The data processing circuit is coupled to a Universal Serial Bus (USB) control unit and a USB interface and includes a detecting unit, a first switch unit, and an audio processing unit. The detecting unit, which is coupled to a configuration channel pin of the USB interface, detects a voltage of the configuration channel pin to generate a detection signal. The first switch unit is coupled to the USB control unit and the USB interface and has a conduction state that is associated with the detection signal. The audio processing unit, which is coupled to the detecting unit, selectively performs an audio signal process. When the first switch unit is conducted, the USB control unit and the USB interface are connected, and the audio processing unit does not perform the audio signal process; when the first switch unit is not conducted, the USB control unit and the USB interface are not connected, and the audio processing unit performs the audio signal process.

A data processing method is also disclosed. The data processing method controls data transmission between a Universal Serial Bus (USB) control unit and a USB interface. This method includes steps of: detecting a voltage of a configuration channel pin of the USB interface to generate a detection signal; determining whether the USB control unit and the USB interface are connected according to the detection signal; and performing an audio signal process when the USB control unit and the USB interface are not connected.

The data processing circuit and data processing method of the present invention are capable of automatically detecting whether a USB device is an audio device, and selectively perform DC offset correction and impedance detection when the USB device is an audio device. Compared to conventional technologies, the data processing circuit and data processing method of the present invention are applicable to a USB Type-C audio device, and provide a solution for de-popping and/or impedance detection for the USB Type-C audio device.

These and other objectives of the present invention no doubt become obvious to those of ordinary skill in the art after reading the following detailed description of the preferred embodiments with reference to the various figures and drawings.

BRIEF DESCRIPTION OF THE DRAWINGS

FIG. 1 shows a pin diagram of a USB Type-C connector, which is a reversible design.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

Figure 2:
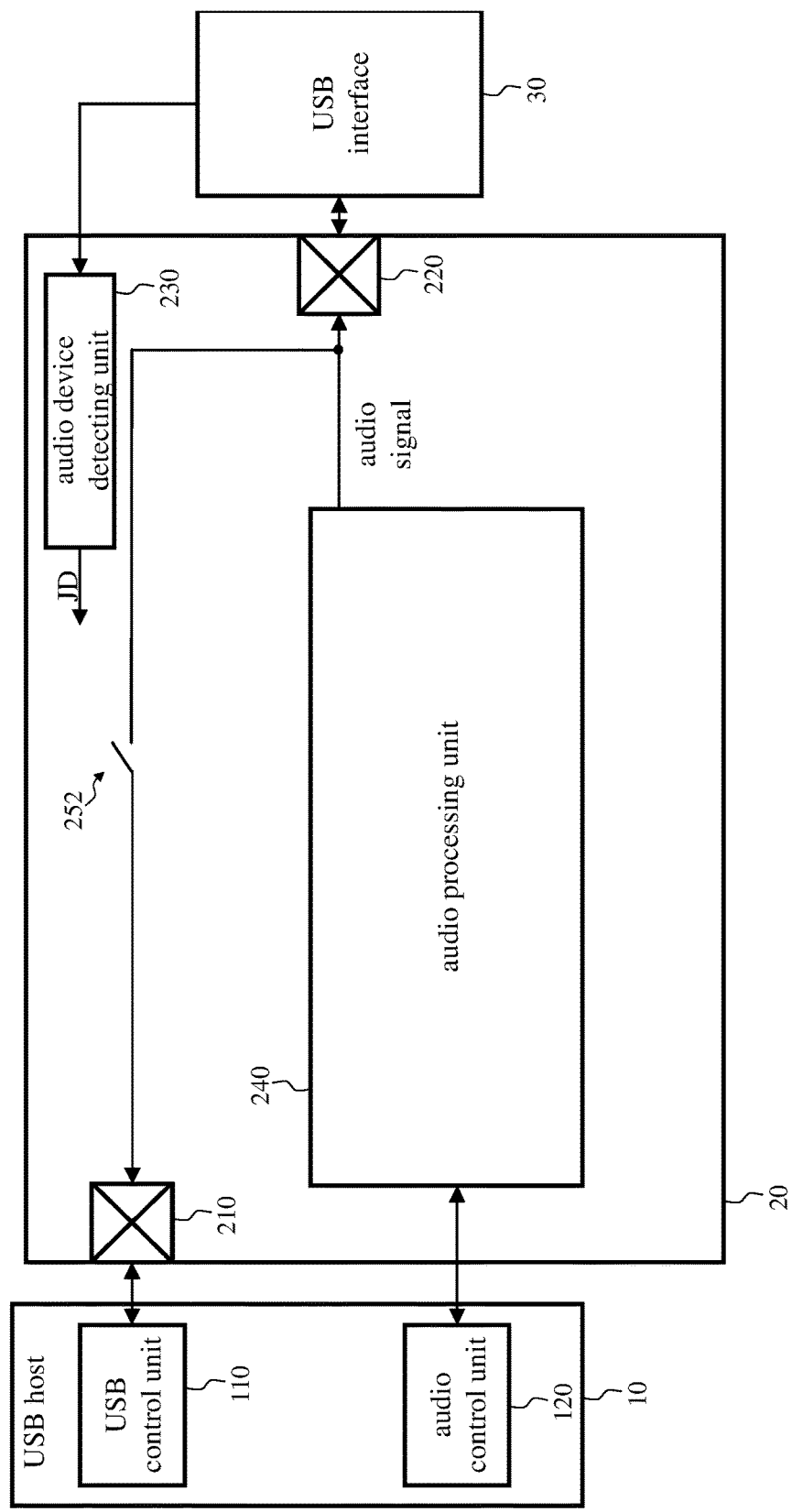
FIG. 2 shows a functional block diagram of a data processing circuit according to an embodiment of the present invention.

FIG. 2 shows a functional block diagram of a data processing circuit according to an embodiment of the present invention. Referring to FIG. 2, a data processing circuit 20 is coupled between a Universal Serial Bus (USB) host 10 and a USB interface 30. A USB control unit 110 of the USB host 10 controls data transmission between the USB host 10 and a USB device (connected to the USB interface 30, not shown). An audio control unit 120 controls an audio decoding operation of the USB host 10.

The data processing circuit 20 is connected to the USB host 10 and the USB interface 30 via pads 210 and 220, respectively. More specifically, the pad 210 and the pad 220 connect the differential signal pair pins A6/B6 and A7/B7 in FIG. 1. The data processing circuit 20 controls whether to conduct the differential signal pair pins A6/B6 and A7/B7 between the USB host 10 and the USB device to control data transmission between the two. The data processing circuit 20 further includes an audio processing unit 240, which supports functions of audio decoding, de-popping and/or impedance detection. The audio processing unit 240 communicates with the audio control unit 120 of the USB host 10 via a High-Definition Audio (HAD) interface, an inter-integrated circuit sound (I²S) interface, or other types of interfaces capable of audio transmission. In one embodiment, the audio control unit 120 transmits audio data in a Pulse Code Modulation (PCM) format to the audio processing unit 240. The audio processing unit 240 converts the audio data to analog audio signals, and outputs the analog audio signals via the pad 220 (i.e., the differential signal pair pins A6/B6 and A7/B7) to the USB device (e.g., earphones) coupled to the USB interface 30. The data processing circuit 20 further includes an audio device detecting unit 230. The audio device detecting unit 230 is connected to a configuration channel pin on the USB interface 30, and detects a voltage change on the configuration channel pin to determine whether the USB device connected to the USB interface 30 is an audio device, e.g., earphones or sound amplifiers. When the USB device is an audio device, the configuration channel pins A5 and B5 are both at a low potential. The audio device detecting unit 230 generates a detection signal JD according to the determination result. The data processing circuit 20 operates in an audio mode or a non-audio mode according to the detection signal JD.

Figure 3:
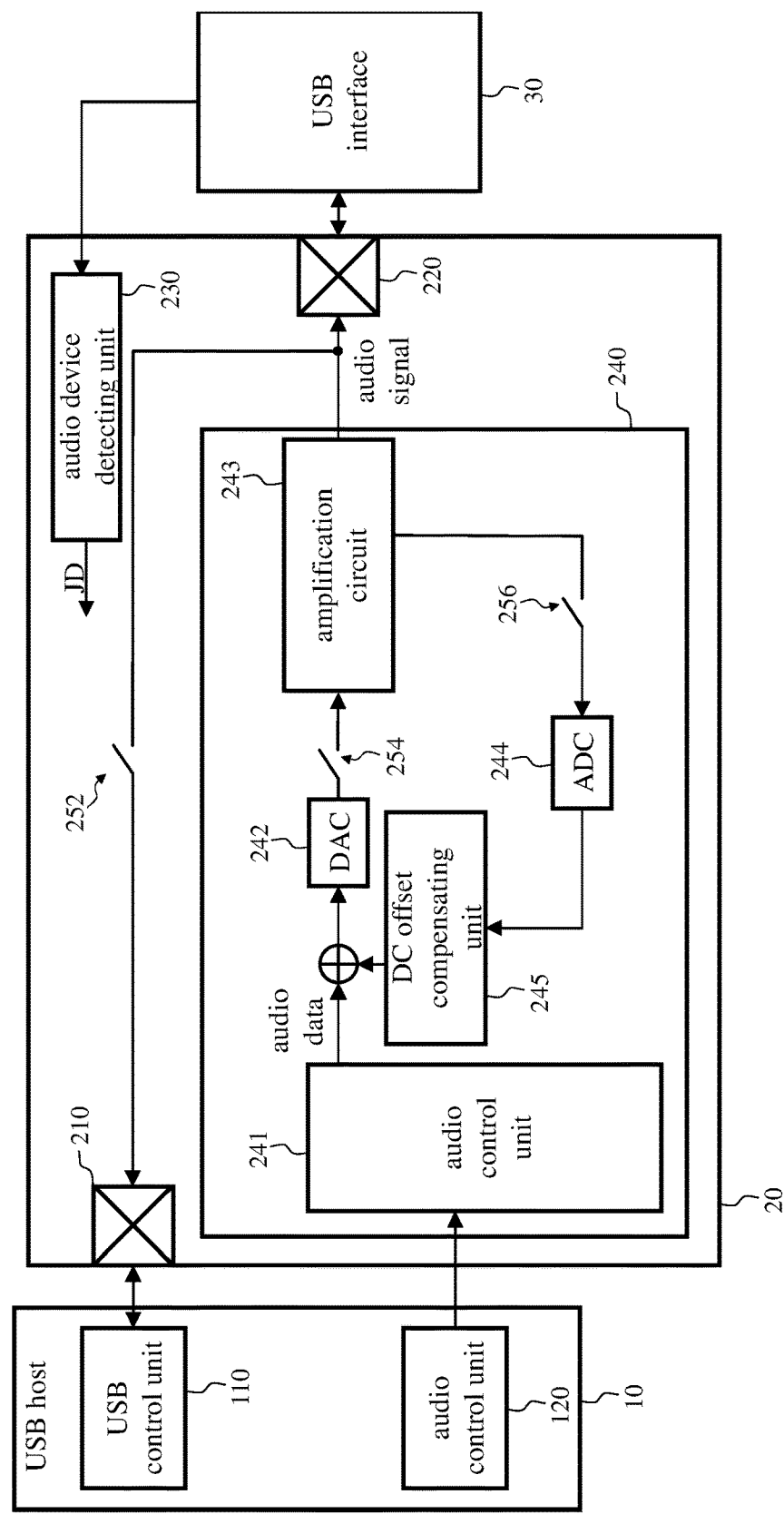
FIG. 3 shows a detailed functional block diagram of the audio processing unit according to an embodiment of the present invention.

FIG. 3 shows a detailed functional block diagram of the audio processing unit 240 according to an embodiment of the present invention. As shown in FIG. 3, the audio processing unit 240 includes an audio control unit 241, a digital-to-analog converter (DAC) 242, an amplification circuit 243, an analog-to-digital converter (ADC) 244, a direct-current (DC) offset compensating unit 245, and switch units 254 and 256. The audio control unit 241 controls an audio decoding operation. For instance, the above operation of converting the audio data from a PCM format to a Pulse Density Modulation (PDM) format is a part of the audio decoding operation. The DAC 242 converts the audio data generated by the audio control unit 241 from a digital domain to an analog domain. The audio data in the analog domain is amplified by the amplification circuit 243 to obtain an amplified audio signal, which is then outputted to the USB interface 30 via the pad 220. When the DAC 242 contains a DC offset, popping occurs in the audio signal. One main purpose of the DC offset compensating unit 245 is to detect the DC offset in the circuit and to compensate the DC offset in the DAC 242 to prevent popping.

Figure 4:
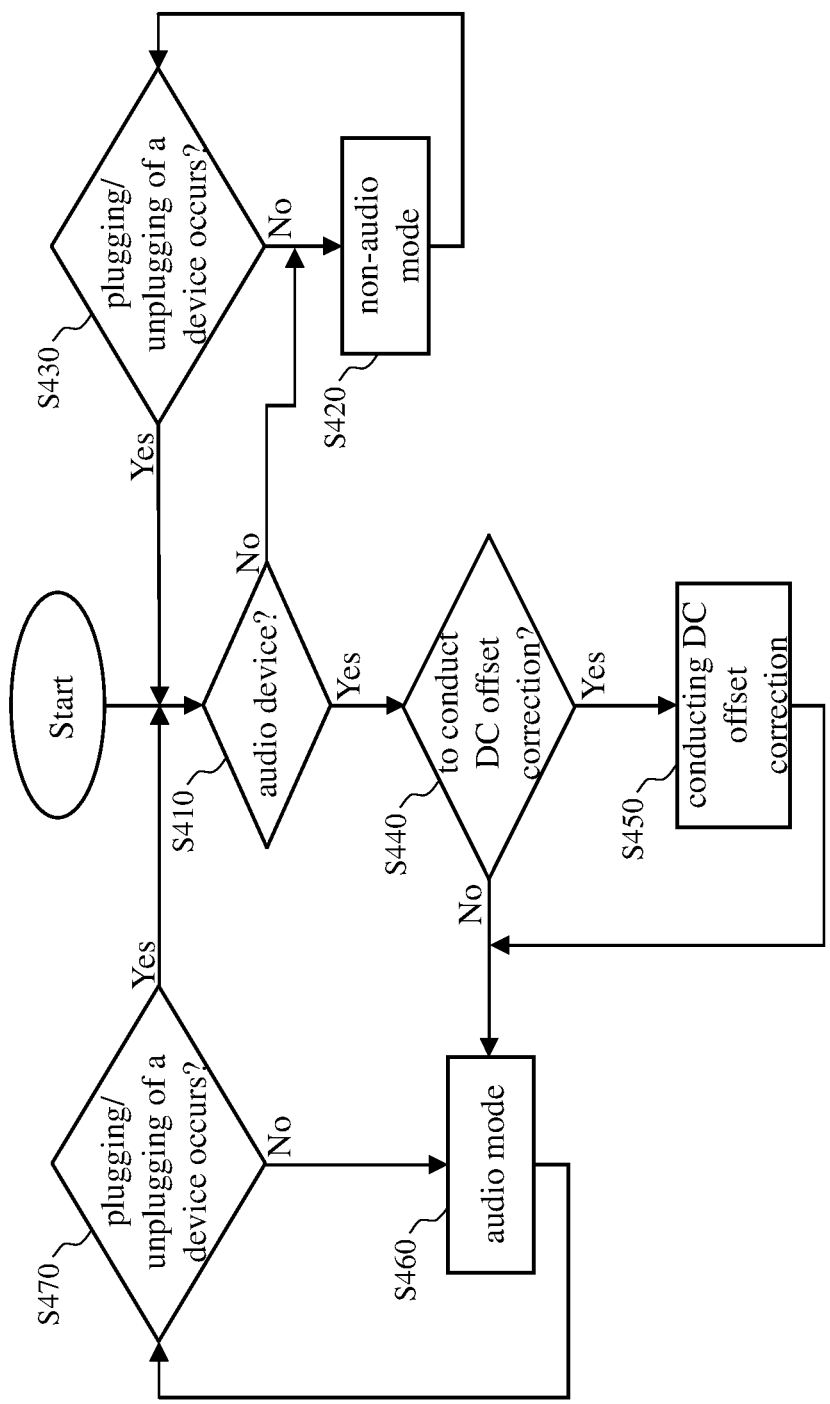
FIG. 4 shows a flowchart of a data processing method according to an embodiment of the present invention.

FIG. 4 shows a flowchart of a data processing method according to an embodiment of the present invention. When the USB device is plugged to the USB interface 30, the audio device detecting unit 230 detects whether the USB device is an audio device (step S410). When the USB device is not an audio device (e.g., represented by a detection signal JD=0), the USB device and the USB host 10 transmit data via the pad 210 and the pad 220, and so the data processing circuit 20 operates in a non-audio mode (step S420). At this point, the switch unit 252 is conducted to establish a data transmission path for the USB host 10 and the USB interface 30 to transmit data. Next, the audio device detecting unit 230 detects whether plugging/unplugging of a device occurs at the USB interface occurs (step S430), e.g., detecting whether a potential change on the configuration channel pin occurs. If not, it means that the current USB device is not replaced, and so the data processing circuit 20 continues operating in the non-audio mode (step S420). If the audio device detecting unit 230 detects plugging/unplugging of a device, it is determined whether the new device is an audio device (step S410). When the new device is an audio device (e.g., represented by a detection signal JD=1), it is determined whether an audio signal process is to be performed. In this embodiment, the audio signal process is a DC offset correction process. When the determination of step S440 is affirmative, the DC offset correction process is performed (step S450), and the data processing circuit 20 enters an audio mode after the DC offset correction process is completed (step S460). When the determination result of step S440 is negative, the data processing circuit 20 skips the DC offset correction process, and directly enters the audio mode (step S460). In the audio mode, the switch unit 252 is not conducted, such that the USB interface 30 cannot receive any data signal from the USB control unit 110. At this point, the USB 30 may receive the audio signal outputted from the audio processing unit 240. Next, the audio device detecting unit 230 detects whether plugging/unplugging of a device occurs at the USB interface 30 occurs (step S470). If not, it means that the current USB device is not replaced, and so the data processing circuit 20 continues operating in the audio mode (step S460). When the audio device detecting unit 230 detects plugging/unplugging of a device, it is again determined whether the new device is an audio device (step S410).

Figure 5:
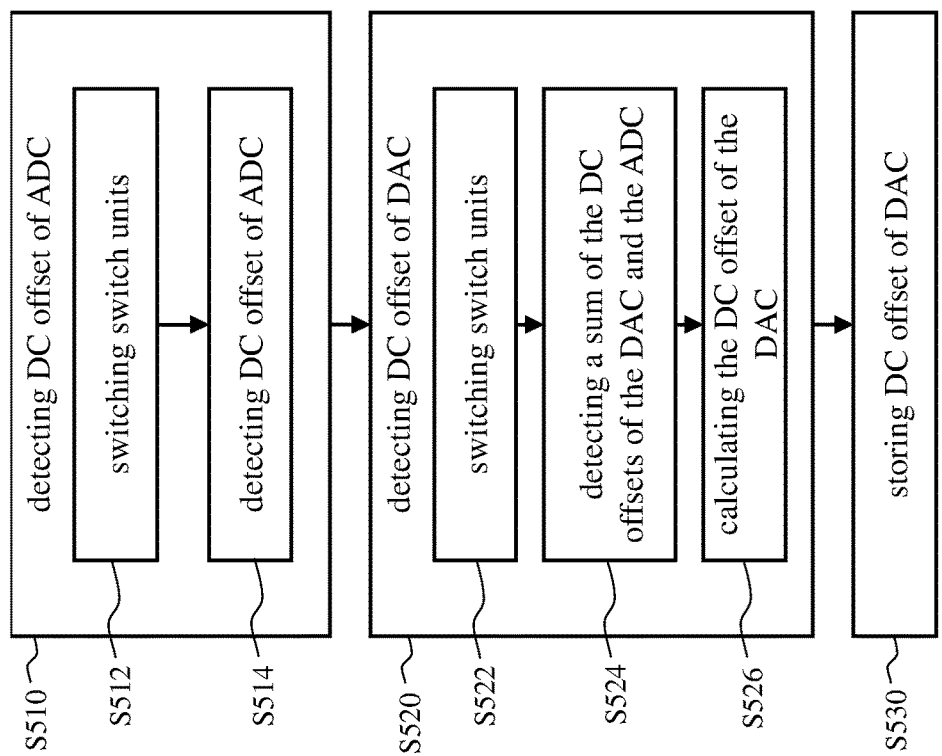
FIG. 5 shows a flowchart of DC offset correction.

FIG. 5 shows a flowchart of DC offset correction. A DC offset of the ADC 244 is first detected (step S510), including a step of switch unit switching (step S512) and a step of DC offset detection (S514). In step S512, the switch unit 252, the switch unit 254 and the switch unit 256 are controlled to be non-conducted. In step S514, the DC offset compensating unit 245 detects the DC offset of the ADC 244. After the detection for the DC offset of the ADC 244 is completed, the DC offset of the DAC 242 is detected (step S520), including a step of switch unit switching (step S522), a step of detecting a sum of the DC offsets of the DAC 242 and the ADC 244 (step S524), and a step of calculating the DC offset of the DAC 242 (step S526). In step S522, the switch unit 252 is controlled to be non-conducted, and the switch unit 254 and the switch unit 256 are controlled to be conducted. In step S524, the DC offset compensating unit 245 detects the sum of the DC offsets of the DAC 242 and the ADC 244. In step S526, the DC offset of the ADC 244 detected in step S514 is subtracted from the sum of the DC offsets detected in step S524 to obtain the DC offset of the DAC 242. Finally, the DC offset of the DAC 242 is stored (step S530).

It should be noted that, the amplification circuit 243 includes multi-stage cascaded amplifiers, and an input end of the ADC 244 is coupled to an input end of the last-stage amplifier, i.e., the output signal of the second-last-stage amplifier is concurrently fed into the last-stage amplifier of the amplification circuit 243 and the ADC 244. In step S522, the last-stage amplifier of the amplification circuit 243 is disabled to prevent interfering the DC offset detection in step S524.

Figure 6:
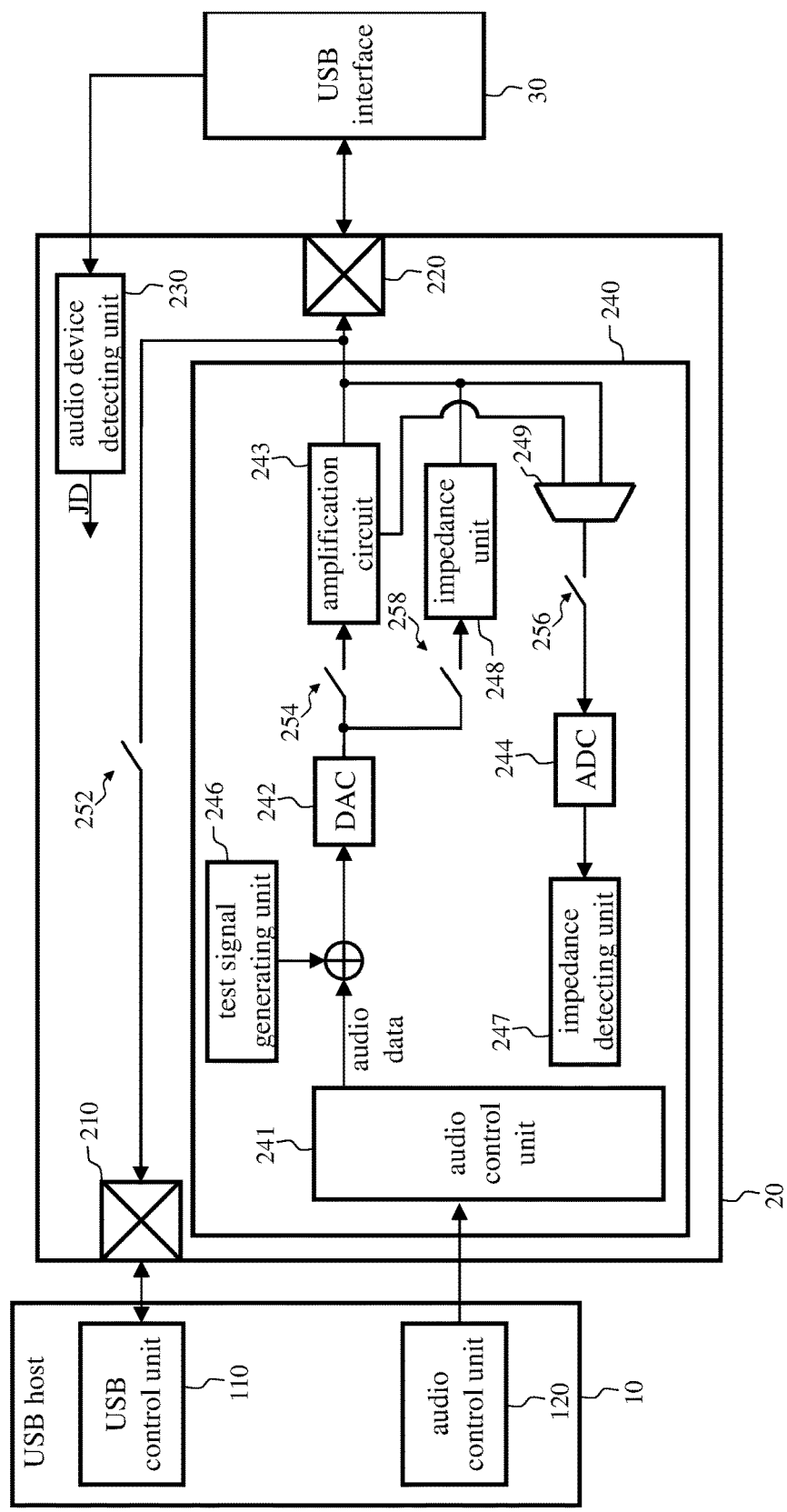
FIG. 6 shows a detailed functional block diagram of the audio processing unit according to another embodiment of the present invention.

FIG. 6 shows a detailed functional block diagram of the audio processing unit 240 according to another embodiment of the present invention. As shown in FIG. 6, the audio processing unit 240 includes the audio control unit 241, the DAC 242, the amplification circuit 243, the ADC 244, a test signal generating unit 246, an impedance detecting unit 247, an impedance unit 248, a multiplexer 249, and switch units 254, 256 and 258. The test signal generating unit 246 generates a test signal, e.g., a low-frequency sinusoidal side tone signal, whose frequency may be lower than a hearing range of the human ear, for example The test signal is converted from the digital domain to the analog domain by the DAC 242. The impedance unit 248 is aimed to provide an impedance value, and may be implemented by a passive element, for example but not limited to, a resistor, an inductor and/or a capacitor. The impedance detecting unit 247 learns the impedance of the audio device coupled to the USB interface 30 according to a digital code outputted from the ADC 244. More specifically, the test signal is voltage divided by the impedance unit 248 and the audio device, and the voltage received at the input end of the ADC 244 is the divided voltage of the test signal on the audio device. That is to say, the voltage that the ADC 244 receives gets larger as the impedance of the audio device is larger, and the digital code generated also becomes larger. Conversely, the voltage that the ADC 244 receives gets smaller as the impedance of the audio device is smaller, and the digital code generated also becomes smaller. The impedance detecting unit 247 may learn the impedance of the audio device according to the value of the digital code.

Figure 7:
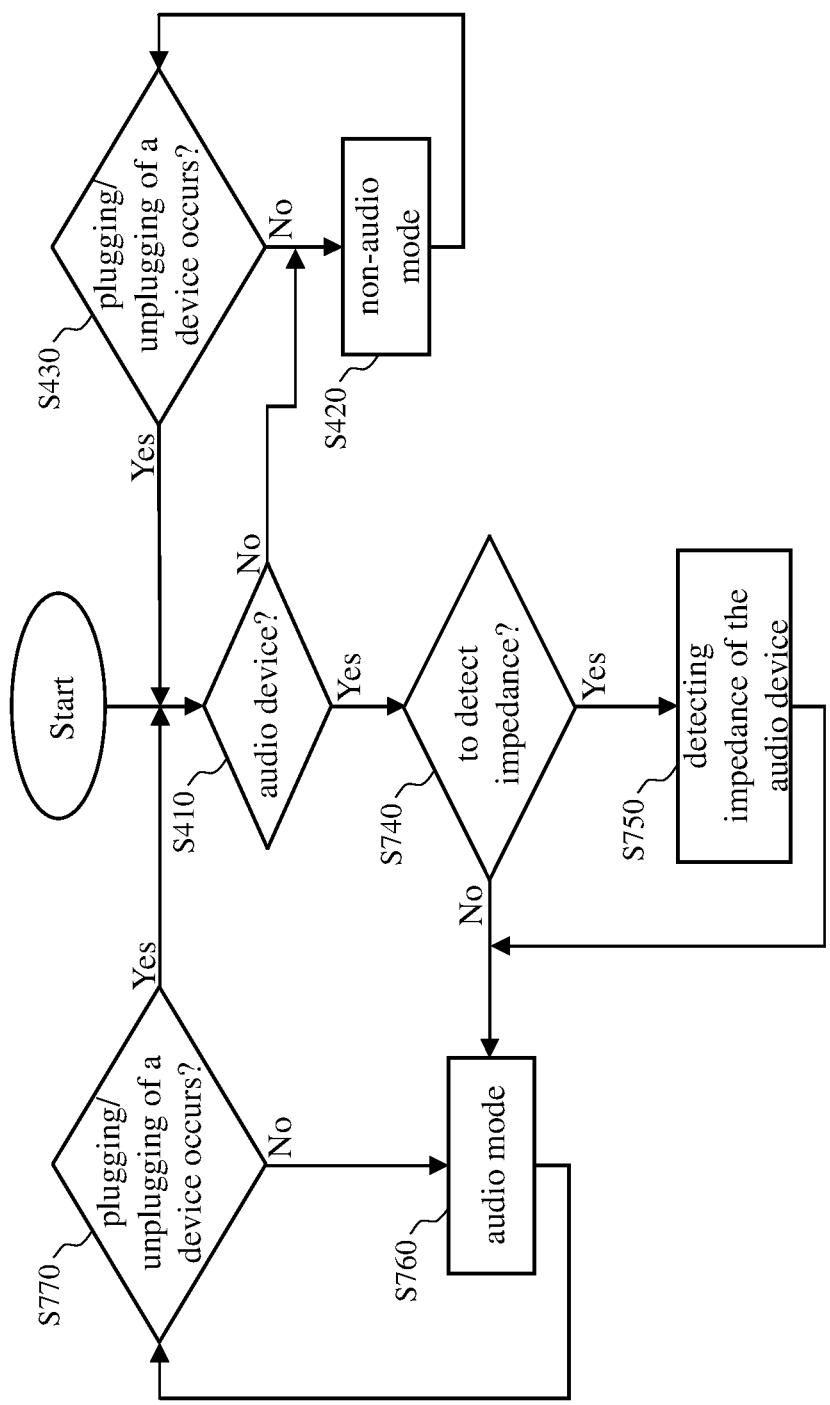
FIG. 7 shows a flowchart of a data processing method according to an embodiment of the present invention.

FIG. 7 shows a flowchart of a data processing method according to an embodiment of the present invention. As shown in the process in FIG. 7, when it is confirmed that a device plugged into the USB interface 30 is an audio device (the determination result of step S410 is affirmative), it is determined next whether an audio signal process is to be performed. In this embodiment, the audio signal process is an impedance detection process. When the determination result of step S740 is affirmative, the impedance detection is performed (step S750), and the data processing circuit 20 enters an audio mode after the detection is completed (step S760). When the determination result of step S740 is negative, the data processing circuit 20 skips the impedance detection process and directly enters the audio mode (step S760). In the audio mode, the switch unit 252 is not conducted, such that the USB interface 30 cannot receive the data signal from the USB control unit 110 but receives the audio signal outputted from the audio processing unit 240. Next, the audio device detecting unit 230 detects whether plugging/unplugging of a device occurs at the USB interface 30 (step S770). If not, it means that the current USB device is not replaced, and so the data processing circuit 20 continues operating in the audio mode (step S760). When the audio device detecting unit 230 detects plugging/unplugging of a device, it is determined whether the new device is an audio device (step S410).

Figure 8:
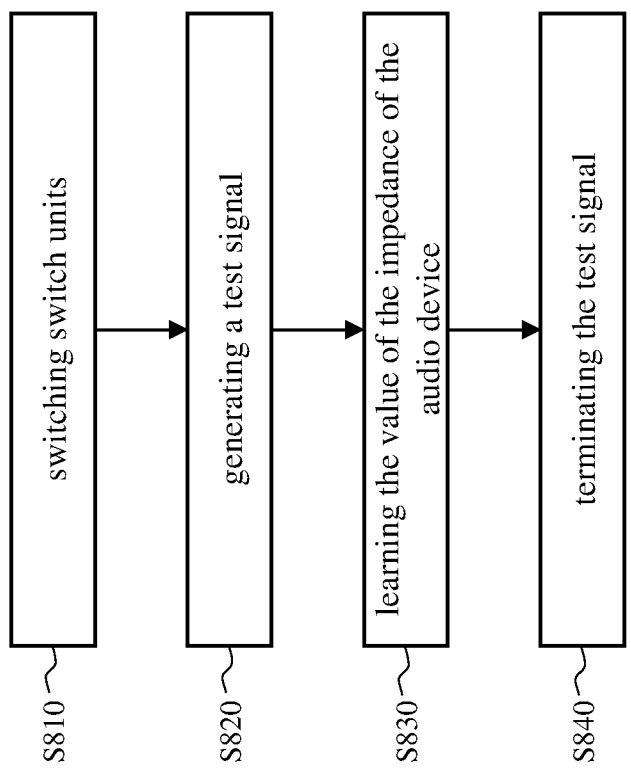
FIG. 8 shows a flowchart of an impedance detection process.

FIG. 8 shows a flowchart of an impedance detection process. The switch units 252 and 254 are controlled to be non-conducted, the switch units 256 and 258 are controlled to be conducted, and the multiplexer 249 is controlled to select the output of the impedance unit 248 as its output (step S810). The test signal generating unit 246 starts to output a test signal (step S820). When an audio device is coupled to the USB interface 30, for the test signal, the impedance of the audio device forms a serial connection with the impedance unit 248. Thus, the input voltage of the ADC 244 is in fact a divided voltage of the test signal on the audio device, and this divided voltage is directly proportional to the impedance of the audio device. That is to say, the impedance detecting unit 247 may learn the value of the impedance of the audio device according to the value of the divided voltage (step S830). After the value of the impedance is learned, the test signal is terminated (step S840).

Figure 9:
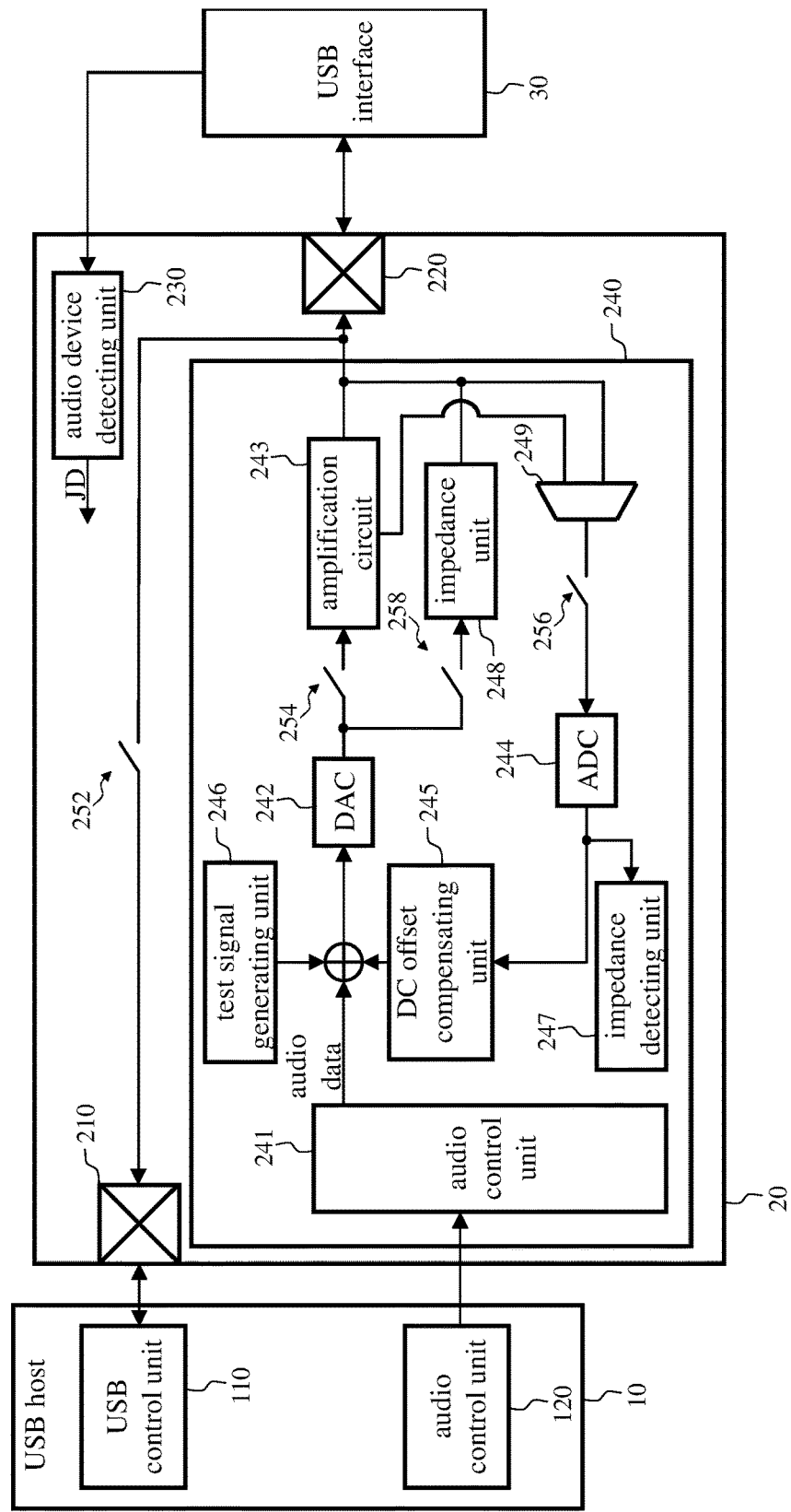
FIG. 9 shows a detailed functional block diagram of the audio processing unit according to another embodiment of the present invention.
Figure 10:
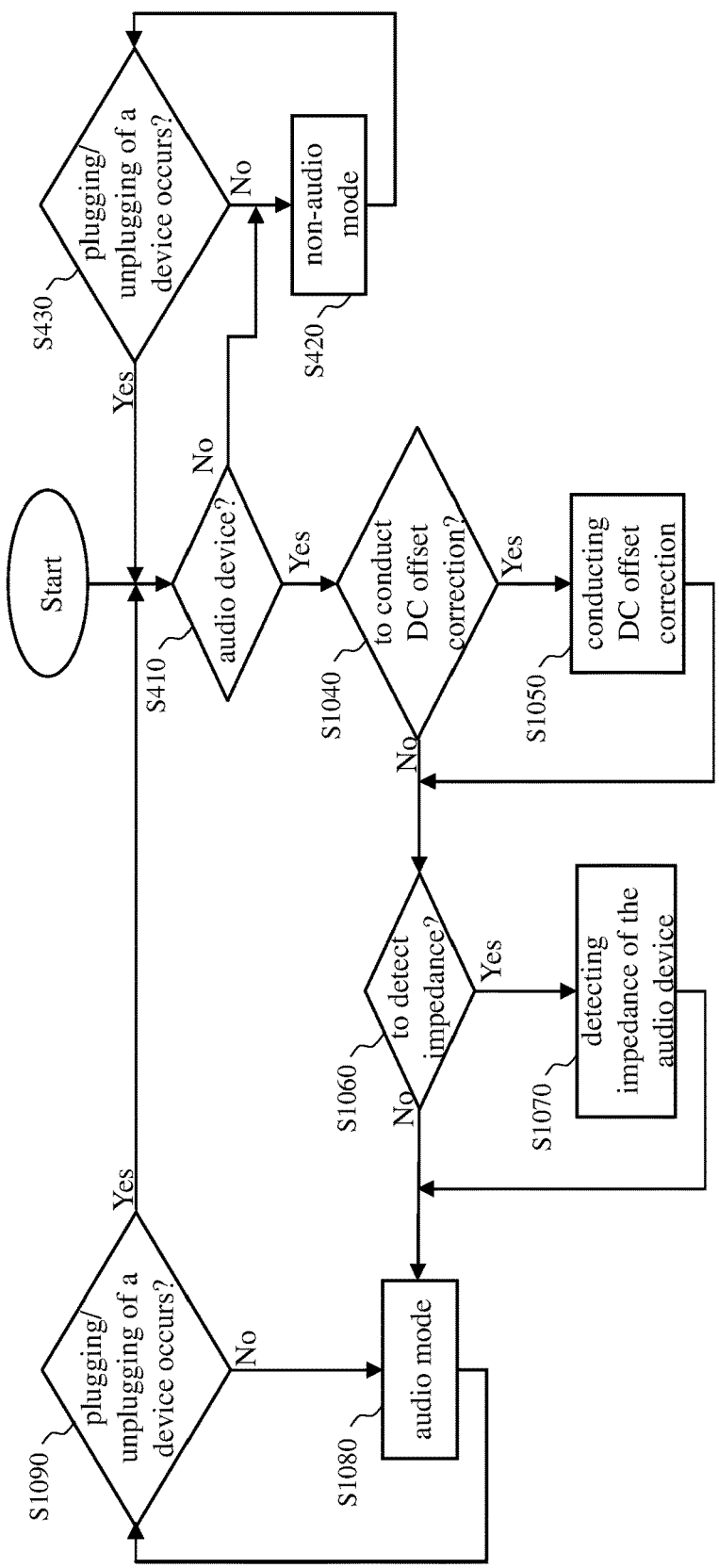
FIG. 10 shows a flowchart of a data processing method corresponding to FIG. 9 according to an embodiment of the present invention.

FIG. 9 shows a detailed functional block diagram of the audio processing unit 240 according to another embodiment of the present invention. As shown in FIG. 9, the audio processing unit 240 includes the audio control unit 241, the DAC 242, the amplification circuit 243, the ADC 244, the DC offset compensating unit 245, the test signal generating unit 246, the impedance detecting unit 247, the impedance unit 248, the multiplexer 249, and the switch units 254, 256 and 258. Functions of these components are described in the foregoing embodiments, and shall be omitted herein. FIG. 10 shows a flowchart of a data processing method corresponding to FIG. 9 according to an embodiment of the present invention. In the process in FIG. 10, when it is confirmed that a device plugged into the USB interface 30 is an audio device (the determination result of step S410 is affirmative), it is determined whether an audio signal process is to be performed. In this embodiment, the audio signal process is a DC offset correction process and an impedance detection process. In the process in FIG. 10, the DC offset correction process is selectively performed (steps S1040 and S1050), the impedance detection process is then selectively performed (steps S1060 and S1070), an audio mode is next entered (step S1080), and it is detected whether plugging/unplugging of a device occurs (step S1090). In an alternative embodiment, the process in FIG. 10 may also first selectively perform the impedance detection process and then selectively perform the DC offset correction process.

The data processing circuit 20 may be a stand-alone circuit or chip, or may be integrated in the USB host 10. When the data processing circuit 20 is a stand-alone circuit or chip, whether the switch units 252, 254, 256 and 258 are conducted, and whether the last-stage amplifier of the amplification circuit 243 is enabled, may be controlled by a control unit (not shown) of the data processing circuit 20 according to the detection signal JD, or may be controlled by the USB host 10 in a way of issuing a parameter to the data processing circuit 20 (e.g., through changing a register value of a register, which is not shown, of the data processing circuit 20) according to the detection signal JD. When the data processing circuit 20 is integrated in the USB host 10, whether the switch units 252, 254, 256 and 258 are conducted, and whether the last-stage amplifier of the amplification circuit 243 is enabled, may be controlled directly by the USB host 10.

Please note that there is no step sequence limitation for the method inventions as long as the execution of each step is applicable. Furthermore, the shape, size, and ratio of any element and the step sequence of any flow chart in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A data processing circuit, coupled to a Universal Serial Bus (USB) control unit and a USB interface, comprising:
    a detecting unit, coupled to a configuration channel pin of the USB interface, detecting a voltage of the configuration channel pin to generate a detection signal;
    a first switch unit, coupled to the USB control unit and the USB interface, a conduction state of the first switch unit being associated with the detection signal; and
    an audio processing unit, coupled to the detecting unit, selectively performing an audio signal process;
    wherein, when the first switch unit is conducted, the USB control unit and the USB interface are connected, and the audio processing unit does not perform the audio signal process; when the first switch unit is not conducted, the USB control unit and the USB interface are not connected, and the audio processing unit performs the audio signal process;

wherein the audio processing unit comprises:
an audio control unit, generating audio data;
a digital-to-analog converter (DAC), converting the audio data from a digital domain to an analog domain;
an amplification circuit, coupled to the DAC, amplifying the audio data in the analog domain to generate an audio signal;
an analog-to-digital converter (ADC), coupled to the amplification circuit;
a direct-current (DC) offset compensating unit, coupled to the ADC, performing a DC offset correction process on the DAC;
a second switch unit, coupled between the DAC and the amplification unit, determining whether to conduct the audio data in the analog domain to the amplification circuit; and
a third switch unit, coupled between the amplification unit and the ADC, determining whether to connect the amplification circuit to the ADC;
wherein the audio signal process comprises the DC offset correction process of the DC offset compensating unit;
wherein when the DC offset compensating unit detects a DC offset of the ADC, the second switch unit and the third switch unit are not conducted; when the DC offset compensating unit detects a sum of respective DC offsets of the ADC and the DAC, the second switch unit and the third switch unit are conducted.

2. The data processing circuit of claim 1, wherein the first switch unit is connected to a differential signal pair pin of the USB interface; and the audio processing unit generates an audio signal, and transmits the audio signal via the differential signal pair pin when the first switch unit is not conducted.

3. The data processing circuit of claim 1, wherein the audio processing unit further comprises:
a test signal generating unit, coupled to the DAC, generating a test signal;
an impedance unit, coupled to the DAC and the ADC, providing an impedance; and
an impedance detecting unit, coupled to the ADC, detecting an impedance of an audio device coupled to the USB interface according to the test signal;
wherein, the audio signal process further comprises an impedance detection process of the impedance detecting unit.

4. The data processing circuit of claim 3, wherein the audio processing unit further comprises:
a fourth switch unit, coupled between the impedance unit and the DAC;
wherein, when the impedance detecting unit detects the impedance of the audio device, the third switch unit and the fourth switch unit are conducted, and the second switch unit is not conducted; when the DC offset compensating unit detects a sum of respective DC offsets of the ADC and the DAC, the fourth switch unit is not conducted.

5. A data processing circuit, coupled to a Universal Serial Bus (USB) control unit and a USB interface, comprising:
a detecting unit, coupled to a configuration channel pin of the USB interface, detecting a voltage of the configuration channel pin to generate a detection signal;
a first switch unit, coupled to the USB control unit and the USB interface, a conduction state of the first switch unit being associated with the detection signal; and
an audio processing unit, coupled to the detecting unit, selectively performing an audio signal process;
wherein, when the first switch unit is conducted, the USB control unit and the USB interface are connected, and the audio processing unit does not perform the audio signal process; when the first switch unit is not conducted, the USB control unit and the USB interface are not connected, and the audio processing unit performs the audio signal process;
wherein the audio processing unit comprises:
a test signal generating unit, generating a test signal;
a DAC, coupled to the test signal generating unit, converting the test signal from a digital domain to an analog domain;
an impedance unit, coupled to the DAC, providing an impedance;
an ADC, coupled to the impedance unit;
an impedance detecting unit, coupled to the ADC, detecting an impedance of an audio device coupled to the USB interface according to the test signal;
a second switch unit, coupled between the DAC and the impedance unit, determining whether to conduct the test signal to the impedance unit; and
a third switch unit, coupled between the impedance unit and the ADC, determining whether to connect the impedance unit and the ADC;
wherein, the audio signal process further comprises an impedance detection process of the impedance detecting unit;
wherein, when the impedance detecting unit detects the impedance of the audio device, the second switch unit and the third switch unit are conducted, and the first switch unit is not conducted; when the first switch unit is conducted, the second switch unit and the third switch unit are not conducted.

6. The data processing circuit of claim 5, wherein the first switch unit is connected to a differential signal pair pin of the USB interface; and the audio processing unit generates an audio signal, and transmits the audio signal via the differential signal pair pin when the first switch unit is not conducted.

* * * * *